US012672577B2

(12) United States Patent
Zeng et al.

(10) Patent No.: US 12,672,577 B2
(45) Date of Patent: Jun. 30, 2026

(54) SEMICONDUCTOR DEVICE AND MANUFACTURING METHOD THEREOF

(71) Applicant: WUHAN XINXIN SEMICONDUCTOR MANUFACTURING CO., LTD., Wuhan (CN)

(72) Inventors: Tian Zeng, Wuhan (CN); Di Zhan, Wuhan (CN); Guoliang Ye, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 446 days.

(21) Appl. No.: 18/252,891

(22) PCT Filed: Dec. 17, 2020

(86) PCT No.: PCT/CN2020/137217
§ 371 (c)(1),
(2) Date: May 15, 2023

(87) PCT Pub. No.: WO2022/116280
PCT Pub. Date: Jun. 9, 2022

(65) Prior Publication Data
US 2023/0402415 A1 Dec. 14, 2023

(30) Foreign Application Priority Data
Dec. 1, 2020 (CN) ........................ 202011388107.X

(51) Int. Cl.
*H01L 23/00* (2006.01)
*H01L 21/18* (2006.01)
*H01L 23/488* (2006.01)

(52) U.S. Cl.
CPC ............ *H01L 24/08* (2013.01); *H01L 21/185* (2013.01); *H01L 23/488* (2013.01); *H01L 2224/80895* (2013.01)

(58) Field of Classification Search
CPC ... H01L 2224/05567; H01L 2224/0557; H01L 21/76898; H01L 23/3171; H01L 23/481; (Continued)

(56) References Cited

U.S. PATENT DOCUMENTS 8,546,188 B2 * 10/2013 Liu ...................... H01L 23/481
438/455
10,163,864 B1 12/2018 England
(Continued)

FOREIGN PATENT DOCUMENTS

CN 109411443 A 3/2019
CN 110379790 A * 10/2019 ............. H10D 1/692
(Continued)

OTHER PUBLICATIONS

Japanese Office Action issued in corresponding Japanese Patent Application No. 2023-534039 dated Jul. 1, 2024.
(Continued)

*Primary Examiner* — Mamadou L Diallo
(74) *Attorney, Agent, or Firm* — Nathan & Associates Patent Agents Ltd.; Menachem Nathan

(57) ABSTRACT

Disclosed in the present disclosure are a semiconductor device and manufacturing method thereof. The method comprises: bonding the front surface of a top wafer to the front surface of a first wafer, and enabling the front surface of the top wafer to face upwards and the front surface of the first wafer to face downwards; bonding the front surface of a second wafer to the back surface of the first wafer to form a bonding structure, and enabling the front surface of the second wafer to face downwards; flipping the bonding
(Continued)

structure to enable the front surface of the first wafer and the front surface of the second wafer to face upwards, and forming a pad pin in a top chip substrate.

20 Claims, 9 Drawing Sheets

(58) Field of Classification Search
CPC .............. H01L 25/0657; H01L 24/94; H01L 2224/06181; H01L 2224/08145; H01L 2225/06544; H01L 2225/06565; H01L 24/08; H01L 21/185; H01L 2224/80895; H01L 24/05; H01L 24/06
See application file for complete search history.

(56) References Cited

U.S. PATENT DOCUMENTS

| | | | | |
|---|---|---|---|---|
| 10,727,205 | B2* | 7/2020 | Wu ......................... | H01L 25/50 |
| 10,797,037 | B1* | 10/2020 | Lin ......................... | H01L 25/50 |
| 10,825,772 | B2* | 11/2020 | Young ..................... | H01L 24/80 |
| 11,004,833 | B1* | 5/2021 | Kandala ................ | H01L 23/481 |
| 2009/0108425 | A1 | 4/2009 | Lee et al. | |
| 2011/0248396 | A1 | 10/2011 | Liu et al. | |
| 2020/0006285 | A1 | 1/2020 | Wang | |
| 2020/0058617 | A1* | 2/2020 | Wu ......................... | H01L 24/80 |
| 2020/0105721 | A1* | 4/2020 | Park ........................ | H01L 24/89 |
| 2020/0161277 | A1* | 5/2020 | Lee ......................... | H01L 25/50 |
| 2020/0243466 | A1* | 7/2020 | Kim ........................ | H01L 24/05 |
| 2020/0303311 | A1* | 9/2020 | Young ..................... | H01L 25/50 |
| 2021/0028151 | A1 | 1/2021 | Li | |
| 2021/0066252 | A1* | 3/2021 | Chen ....................... | H01L 24/13 |
| 2021/0098423 | A1* | 4/2021 | Chen ....................... | H01L 24/08 |
| 2022/0045035 | A1* | 2/2022 | Park ....................... | H01L 25/18 |
| 2022/0077126 | A1* | 3/2022 | Choi ...................... | H10B 43/27 |
| 2023/0053721 | A1 | 2/2023 | Hu | |
| 2023/0170320 | A1* | 6/2023 | Yu .......................... | H01L 24/06 |
| | | | | 257/777 |

FOREIGN PATENT DOCUMENTS

| | | | | |
|---|---|---|---|---|
| CN | 111244057 | A | 6/2020 | |
| CN | 111564368 | A | 8/2020 | |
| JP | 2012500504 | A | 1/2012 | |
| KR | 10-2011-0042062 | A | 4/2011 | |
| WO | WO-2021087720 | A1 * | 5/2021 | ............. H01L 24/08 |

OTHER PUBLICATIONS

Korean Office Action issued in corresponding Korean Patent Application No. 10-2023-7017396dated Jul. 16, 2024.

Chinese Office Action issued in corresponding Chinese Patent Application No. 202011388107.X dated Apr. 13, 2023, pp. 1-7.

International Search Report in International application No. PCT/CN2020/137217, mailed on Dec. 17, 2020.

Written Opinion of the International Search Authority in International application No. PCT/CN2020/137217, mailed on Dec. 17, 2020.

* cited by examiner

SEMICONDUCTOR DEVICE AND MANUFACTURING METHOD THEREOF

The present disclosure claims priority of Chinese Patent Application No. 202011388107.X, filed on Dec. 1, 2020, entitled "semiconductor device and manufacturing method thereof", the disclosure of which is incorporated herein by reference in its entirety.

TECHNICAL FIELD

The present disclosure relates to a technical field of semiconductor technology, and in particular, to a semiconductor device and manufacturing method thereof.

TECHNICAL BACKGROUND

At present, size of chip transistors is approaching physical limit, and improvement in performance of chips depends more on the development of the three-dimensional integration technology. By stacking multiple chips in three dimensions, the overall performance and space utilization of chips can be greatly improved, and the producing cost of chips can be reduced.

Multi-chip stacking is generally obtained by cutting the stacked multi-wafer after the multi-wafer stacking. In the prior art, the multi-wafer stacking is basically achieved by bonding front sides of two wafers face to face, and then forming a bonding interface on a back side of one of the bonded wafers, so that the two bonded wafers can be bonded to a third wafer. With the increasing number of stacked wafers, how to realize the circuit design and process flow of the stacked wafers unified and further simplify the stacking process is an urgent problem to be solved.

SUMMARY OF THE INVENTION

Technical Problem

The present disclosure provides a semiconductor device and manufacturing method thereof, which can make the front sides of all wafers at the bottom of a top wafer face upwards, realize unifying of the circuit design and process flow of the bottom wafers, reduce the process complexity, and improve the structural flexibility.

Solutions to the Problems

Technical Solutions

The present disclosure provides a method for manufacturing a semiconductor device, which comprises:

providing a top wafer, wherein the top wafer comprises a top chip substrate and a top chip bonding pad disposed on a front side of the top chip substrate;

providing a first wafer, wherein the first wafer comprises a first substrate, and a first device and a first bonding pad that are disposed on a front side of the first substrate;

bonding the front side of the top wafer to the front side of the first wafer, and electrically connecting the top chip bonding pad to the first bonding pad, so that the front side of the top wafer faces upwards, and the front side of the first wafer faces downwards;

forming, on a back side of the first substrate, a first interconnection layer comprising a first interconnection layer-bonding pad;

providing a second wafer, wherein the second wafer comprises a second substrate, a second device and a second bonding pad that are disposed on a front side of the second substrate;

bonding the front side of the second wafer to the first interconnection layer, and electrically connecting the first interconnection layer-bonding pad to the second bonding pad, so that the second wafer is bonded to the first wafer to form a bonding structure in which the front side of the second wafer faces downwards; and flipping the bonded structure to put a back side of the top chip substrate to the top, enabling the front side of the first wafer to face upwards and the front side of the second wafer to face upwards, and forming a pad pin in the top chip substrate.

Further optionally, the step of "forming, on a back side of the first substrate, a first interconnection layer comprising a first interconnection layer-bonding pad" comprises:

thinning the back side of the first substrate; and forming the first interconnection layer on the back surface of the first substrate, wherein the first interconnection layer-bonding pad is formed in the first interconnection layer.

Further optionally, the step of "forming a pad pin in the top chip substrate" comprises:

thinning the back side of the top chip substrate;

forming a via penetrating through the top chip substrate;

forming a protective layer on the back side of the top chip substrate, and sidewalls and a bottom of the via; and forming a pad pin on the protective layer on the bottom of the via.

Further optionally, wherein after the step of "bonding the front side of the second wafer to the first interconnection layer", and before the step of "flipping the bonding structure", the method further comprises:

forming, on the back side of the second substrate, a second interconnection layer comprising a second interconnection layer-bonding pad;

providing a third wafer, wherein the third wafer comprises a third substrate, and a third device and a third bonding pad that are disposed on a front side of the third substrate;

bonding a front side of the third wafer to the second interconnection layer, and electrically connecting the second interconnection layer-bonding pad to the third bonding pad, so that the third wafer is bonded to the second wafer in which the front side of the third wafer faces downwards.

Further optionally, the top wafer further comprises a top chip conductive layer between the top chip substrate and the top chip bonding pad, and the top chip conductive layer is electrically connected to the top chip bonding pad and the pad pin, respectively;

the first wafer further comprises a first conductive layer between the first device and the first bonding pad, and the first conductive layer is electrically connected to the first device, the first bonding pad, and the first interconnection layer-bonding pad, respectively; and the second wafer further comprises a second conductive layer between the second device and the second bonding pad, and the second conductive layer is electrically connected to the second device and the second bonding pad, respectively.

Further optionally, the top chip conductive layer comprises a top chip top conductive layer and a top chip bottom conductive layer that are electrically connected, the top chip top conductive layer is electrically connected to the top chip bonding pad, and the top chip bottom conductive layer is electrically connected to the pad pin;

the first conductive layer comprises a first top conductive layer and a first bottom conductive layer, the first top conductive layer is electrically connected to the first bonding pad, and the first bottom conductive layer is electrically connected to the first device and the first interconnection layer-bonding pad; and the second conductive layer comprises a second top conductive layer and a second bottom conductive layer that are electrically connected, the second top conductive layer is electrically connected to the second bonding pad, and the second bottom conductive layer is electrically connected to the second device.

Further optionally, a material of the top chip conductive layer, the first interconnection-layer bonding pad, the first bonding pad, and the second bonding pad is copper, and a material of the first conductive layer, the second conductive layer, and the pad pin is aluminum.

Further optionally, the top wafer is a logic wafer, and the first wafer and the second wafer are memory wafers.

Accordingly, the present disclosure further provides a semiconductor device, which comprises:

a first chip comprising a first substrate and a first device and a first bonding pad disposed on a front side of the first substrate;

a top chip disposed on a front side of the first chip, wherein the top chip comprises a top chip substrate and a top chip bonding pad disposed between the top chip substrate and the first chip, the top chip bonding pad is electrically connected to the first bonding pad, so that a front side of the top wafer is bonded face to face with the front side of the first wafer;

a pad pin disposed on a back side of the top chip;

a first interconnection layer on a back side of the first chip, wherein the first interconnection layer comprises a first interconnection layer-bonding pad; and a second chip on a side of the first interconnection layer away from the first chip, wherein the second chip comprises a second substrate and a second device and a second bonding pad on a front side of the second substrate, and the second bonding pad is electrically connected to the first interconnection layer-bonding pad so that a front side of the second chip is bonded to the first interconnection layer.

Further optionally, the semiconductor device further comprises:

a second interconnect layer disposed on a back side of the second chip, wherein the second interconnect layer comprises a second interconnection layer-bonding pad; and a third chip disposed at the second interconnect layer away from the second chip, wherein the third chip comprises a third substrate and a third device and a third bonding pad disposed on a front side of the third substrate, and the third bonding pad is electrically connected to the second interconnection layer-bonding pad so that a front side of the third chip is bonded to the second interconnection layer.

Further optionally, the top wafer further comprises a top chip conductive layer between the top chip substrate and the top chip bonding pad, and the top chip conductive layer is electrically connected to the top chip bonding pad and the pad pin, respectively;

the first chip further comprises a first conductive layer between the first device and the first bonding pad, and the first conductive layer is electrically connected to the first device, the first bonding pad, and the first interconnection layer-bonding pad, respectively; and the second chip further comprises a second conductive layer between the second device and the second bonding pad, and the second conductive layer is electrically connected to the second device and the second bonding pad, respectively.

Further optionally, the top chip conductive layer comprises a top chip top conductive layer and a top chip bottom conductive layer that are electrically connected, the top chip top conductive layer is electrically connected to the top chip bonding pad, and the top chip bottom conductive layer is electrically connected to the pad pin;

the first conductive layer comprises a first top conductive layer and a first bottom conductive layer, the first top conductive layer is electrically connected to the first bonding pad, and the first bottom conductive layer is electrically connected to the first device and the first interconnection layer-bonding pad; and the second conductive layer comprises a second top conductive layer and a second bottom conductive layer, the second top conductive layer is electrically connected to the second bonding pad, and the second bottom conductive layer is electrically connected to the second device.

Further optionally, a material of the top chip conductive layer, the first interconnection layer-bonding pad, the first bonding pad, and the second bonding pad is copper, and a material of the first conductive layer, the second conductive layer, and the pad pin is aluminum.

Further optionally, the top chip is a logic chip, and the first chip and the second chip are memory chips.

Further optionally, the front side of the first chip faces towards a direction the same as that of the second chip, and the front side of the top chip faces towards a direction opposite to the front side of the first chip.

Further optionally, the semiconductor device further comprises a via penetrating through the top chip substrate, and a protective layer disposed on the back side of the top chip substrate, and sidewalls and a bottom of the via; and the pad pin is disposed on the protective layer at the bottom of the via.

Technical Effects of the Invention

Technical Effects

The present disclosure has the following advantages: after bonding the front side of the top wafer to the front side of the first wafer, a first interconnection layer is formed on a back side of the first substrate, so that the front side of the second wafer is bonded to the first interconnection layer, thus forming a bonding structure. Then the bonding structure is flipped to put a back side of the top wafer to the top, so as to form a pad pin on the back side of the top wafer, allowing the front side of the top wafer to face downwards and the front sides of the first and second wafers to face upwards, so that the front sides of all wafers at the bottom of the top wafer face upwards, thus realizing unifying of circuit design and process flow of the bottom wafers, reducing the process complexity, adjusting bonding sequence among the bottom wafers at will, and improving the structural flexibility.

BRIEF DESCRIPTION OF THE DRAWINGS

Description of the Drawings

In order to more clearly describe the technical solutions in examples of the present disclosure or in the prior art, hereinafter, the appended drawings used for describing the examples in the present disclosure or in the prior art will be briefly introduced. Apparently, the appended drawings described below are only directed to some examples of the present disclosure, and for a person skilled in the art, without expenditure of creative labor, other drawings can be derived on the basis of these appended drawings.

Figure 1:
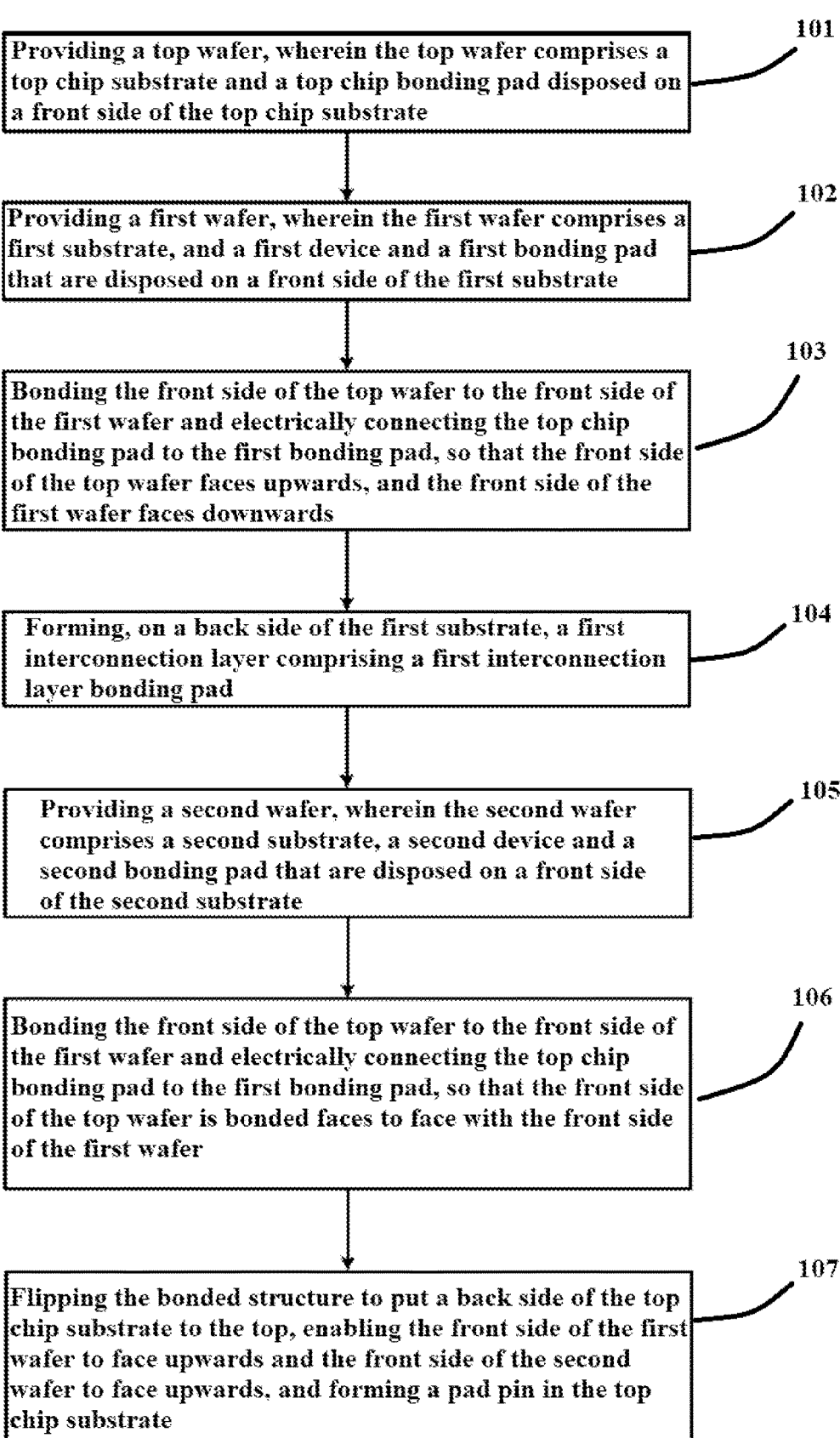
Figure 3:
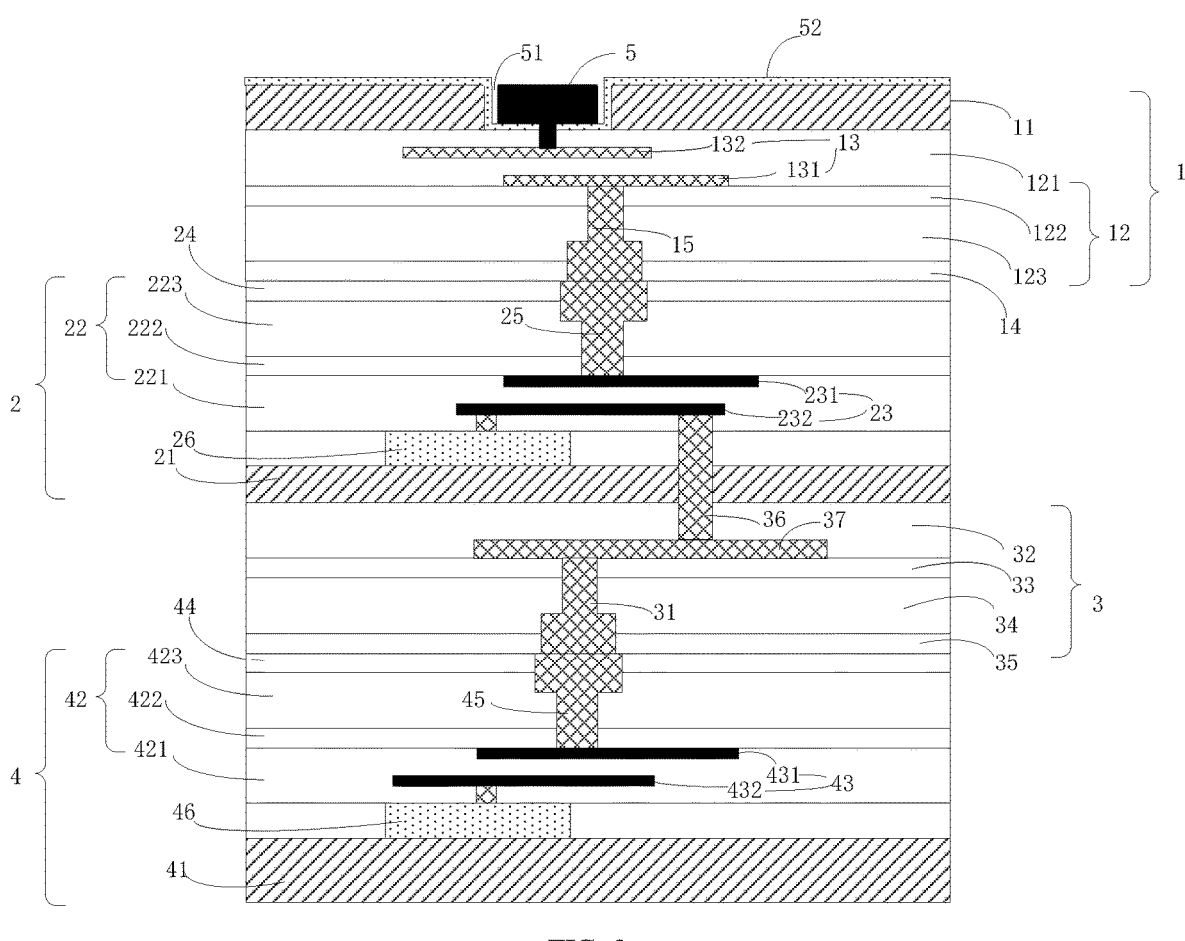
Figure 4:
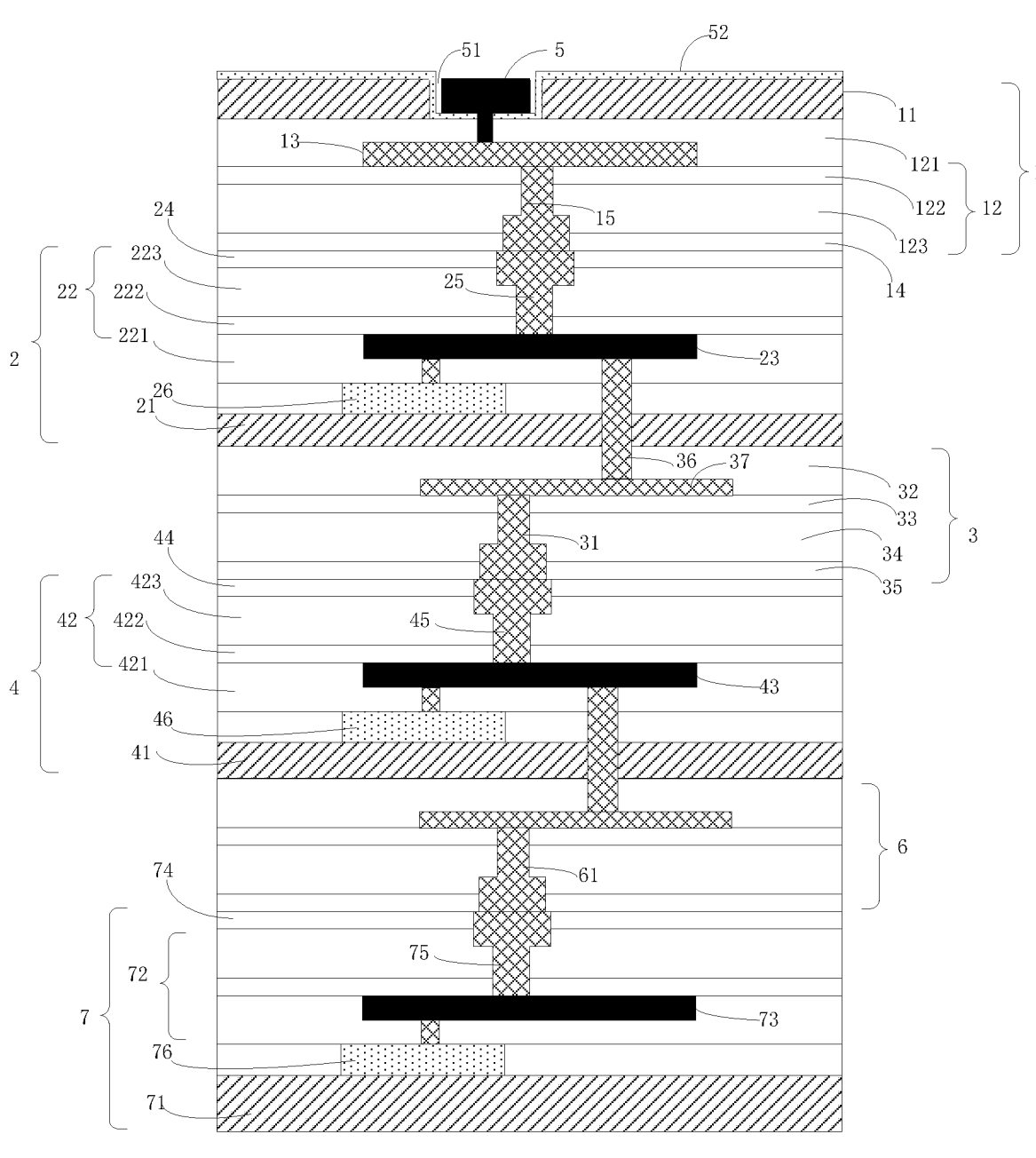
Figure 5:
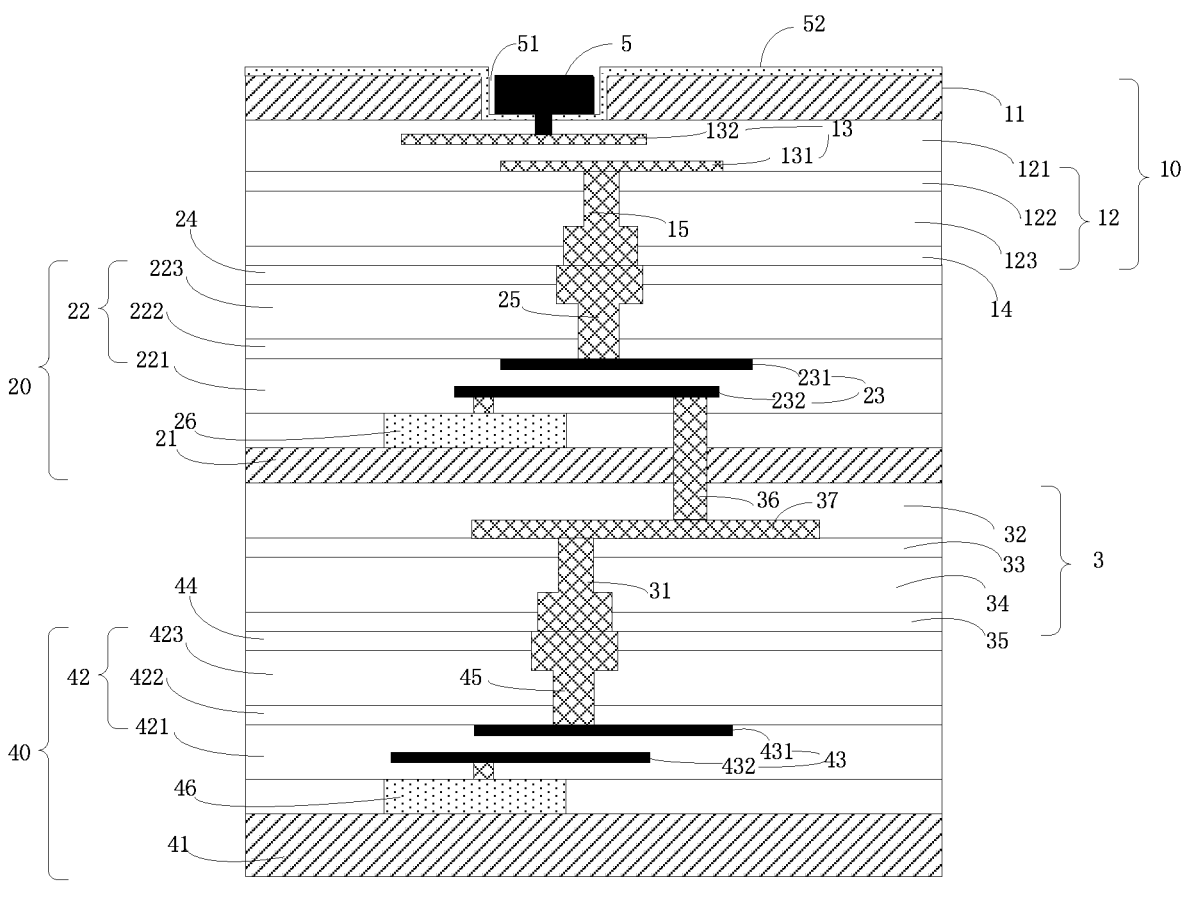
Figure 6:
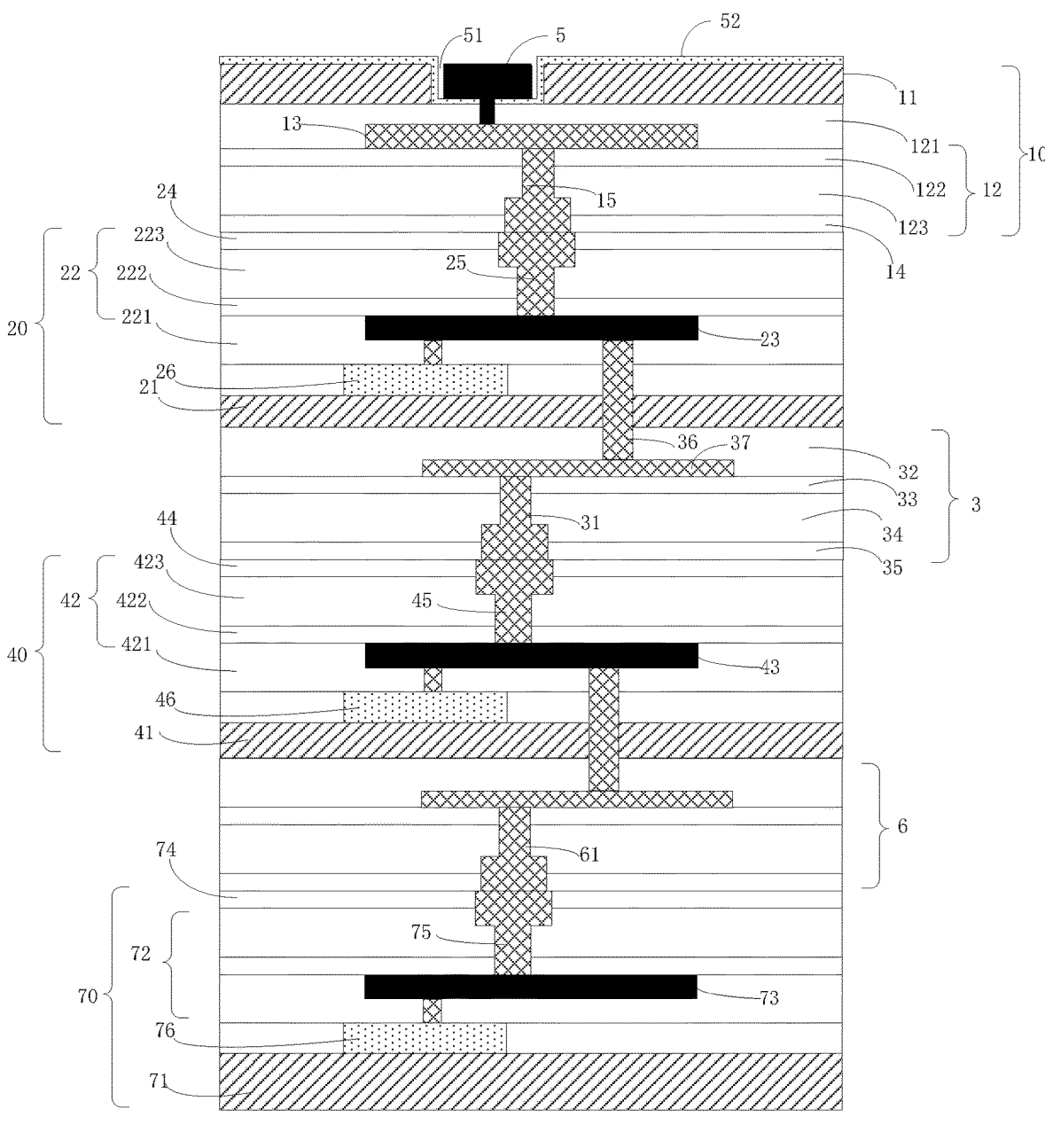

FIG. 1 is a schematic flowchart of a method for manufacturing a semiconductor device according to an example of the present disclosure;

FIG. 2*a* to FIG. 2*h* are schematic structural diagrams of a method for manufacturing a semiconductor device according to an example of the present disclosure;

FIG. 3 is a schematic structural diagram of a semiconductor device according to an example of the present disclosure;

FIG. 4 is a schematic structural diagram of another semiconductor device according to an example of the present disclosure;

FIG. 5 is a schematic structural diagram of yet another semiconductor device according to an example of the present disclosure; and FIG. 6 is a schematic structural diagram of yet another semiconductor device according to an example of the present disclosure.

EXAMPLES OF THE INVENTION

Embodiments of the Present Invention

Specific structure and function details disclosed herein are only representative and are used for the purpose of describing exemplary examples of the present disclosure. However, the present disclosure may be specifically achieved in many alternative forms and shall not be interpreted to be only limited to the examples described herein.

It should be understood in the description of the present disclosure that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present disclosure and the simplification of the description rather than to indicate or imply that the indicated apparatus or assembly must have a specific direction or constructed and operated in a specific direction, and therefore, shall not be understood as a limitation to the present disclosure. In addition, the terms such as "first" and "second" are only used for the purpose of description, rather than being understood to indicate or imply relative importance or hint the number of indicated technical features. Thus, the feature limited by "first" and "second" can explicitly or implicitly comprise one or more features. In the description of the present disclosure, the meaning of "a plurality of" is two or more unless otherwise specified. In addition, the term "include" and any variant are intended to cover non-exclusive inclusion.

It should be noted in the description of the present disclosure that, unless otherwise specifically regulated and defined, terms such as "installation", "bonded" and "bonding" shall be understood in broad sense, and for example, may refer to fixed bonding or detachable bonding or integral bonding, may refer to mechanical bonding or electrical bonding, and may refer to direct bonding or indirect bonding through an intermediate medium or inner communication of two assemblies. For those of ordinary skill in the art, the meanings of the above terms in the present disclosure may be understood according to specific conditions.

The terms used herein are intended to merely describe specific examples, not to limit the exemplary examples. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

With respect to FIG. 1, a method for producing a semiconductor device according to an example of the present disclosure.

As shown in FIG. 1, the method for producing a semiconductor device according to an example of the present disclosure includes Steps 101 to 107:

Step 101: providing a top wafer, wherein the top wafer includes a top chip substrate and a top chip bonding pad disposed on a front side of the top chip substrate.

Figure 2A:
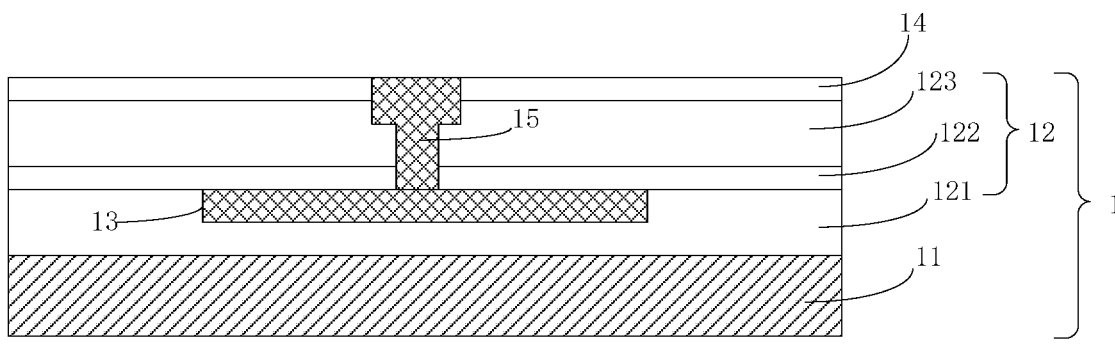

A plurality of top chips are disposed in an array on a top wafer. FIG. 2*a* is a cross-sectional view showing a single top chip in the top wafer. As shown in FIG. 2*a*, the top wafer 1 includes a top chip substrate 11, which may be a semiconductor substrate such as a Si substrate, a Ge substrate, a SiGe substrate, or the like, and may also be a semiconductor substrate including other elements or compounds. The front side of the top chip substrate 11 may be formed with a top chip device with various functions (not shown), which may include a MOS device, a sensor, a memory or other passive device, so that the top wafer constitutes a wafer with different functions, for example, the top wafer may be a logical wafer.

The top chip device is covered with a top chip dielectric layer 12, which may be a single layer or multiple layers. For example, as shown in FIG. 2*a*, the top chip dielectric layer 12 may include a top chip insulating layer 121, a top chip barrier layer 122, and an top chip interlayer dielectric layer 123 disposed in sequence. The top chip dielectric layer 12 is provided with a top chip conductive layer 13, for example, the top chip conductive layer 13 is disposed in the top chip insulating layer 121, and the top chip device is electrically connected to the top chip conductive layer 13. The material of the top chip dielectric layer 12 may be a dielectric material such as silicon oxide, silicon nitride, nitrogen-doped silicon carbide (NDC). The material of the top chip conductive layer 13 may be a metallic material such as copper, aluminum, tungsten, or the like, and copper is preferred in this example. A top chip bonding layer 14 is formed on the top chip dielectric layer 12, and the material of the top chip bonding layer 14 can be silicon oxide, silicon nitride, silicon carbonitride, or the like.

The top chip bonding layer 14 and the top chip dielectric layer 12 are provided with a top chip bonding pad 15 electrically connected to the top chip conductive layer 13. As shown in FIG. 2*a*, the top chip bonding pad 15 longitudinally penetrates through the top chip bonding layer 14, the top chip interlayer dielectric layer 123 and the top chip barrier layer 122, and is in contact with the top chip conductive layer 13, so as to realize an electrical connection between the top chip bonding pad 15 and the top chip conductive layer 13, that is, the top chip bonding pad 15 is a lead-out structure of the top chip conductive layer 13. The top chip bonding pad 15 may be a damascene structure. The material of the top chip bonding pad 15 is a conductive material, such as copper, aluminum, tungsten, or the like, and copper is preferred in this example.

Step 102: providing a first wafer, which includes a first substrate, and a first device and a first bonding pad that are disposed on a front side of the first substrate.

Figure 2B:
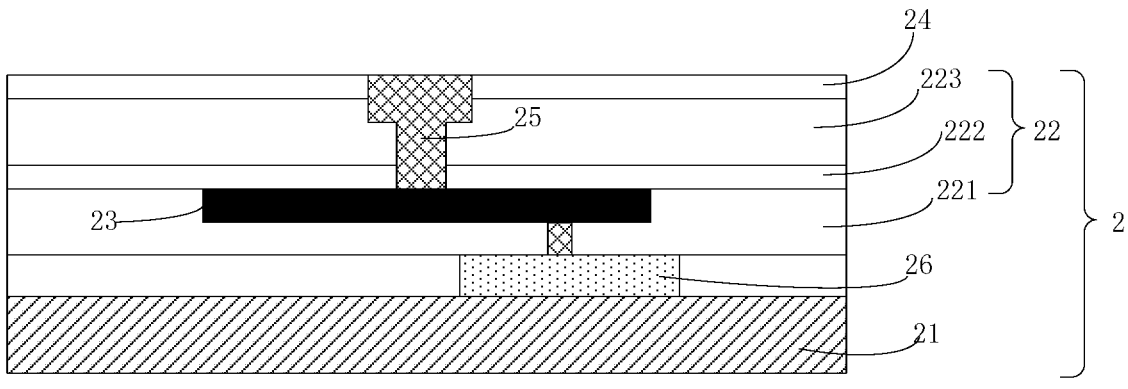

A plurality of first chips are disposed in an array on the first wafer. FIG. 2*b* is a cross-sectional view showing a single first chip in the first wafer. As shown in FIG. 2*b*, the first wafer 2 includes a first substrate 21, which may be a semiconductor substrate. The front side of the first substrate 21 may be formed with a first device 26 with various functions. The first device 26 may include a MOS device, a sensor, a memory or other passive device, so that the first wafer 2 constitutes a wafer with different functions, for example, the first wafer 2 may be a memory wafer. It should be noted that the first wafer 2 and the top wafer 1 are wafers with different functions.

The first device 26 is covered with a first dielectric layer 22, which may be a single layer or multiple layers. For example, as shown in FIG. 2*b*, the first dielectric layer 22 may include a first insulating layer 221, a first barrier layer 222 and a first interlayer dielectric layer 223 disposed in sequence. The first dielectric layer 22 is provided with a first conductive layer 23, for example, the first conductive layer 23 is disposed in the first insulating layer 221, and the first device 26 is electrically connected to the first conductive layer 23. The material of the first dielectric layer 22 may be a dielectric material such as silicon oxide, silicon nitride, or NDC. The material of the first conductive layer 23 may be a metallic material such as aluminum, copper, or tungsten, or the like, and aluminum is preferred in this example. The first dielectric layer 22 is formed with a first bonding layer 24 thereon, and a material of the first bonding layer 24 may be silicon oxide, silicon nitride, silicon carbonitride, or the like.

The first bonding layer 24 and the first dielectric layer 22 are provided with a first bonding pad 25 electrically connected with the first conductive layer 23. As shown in FIG. 2*b*, the first bonding pad 25 longitudinally penetrates through the first bonding layer 24, the first interlayer dielectric layer 223 and the first barrier layer 222, and is in contact with the first conductive layer 23, so as to realize an electrical connection between the first bonding pad 25 and the first conductive layer 23, that is, the first bonding pad 25 is a lead-out structure of the first conductive layer 23. The first bonding pad 25 may be a damascene structure. The material of the first bonding pad 25 is a conductive material, such as copper, aluminum, tungsten, or the like, and copper is preferred in this example.

Step 103: bonding the front side of the top wafer to the front side of the first wafer, wherein the top chip bonding pad is electrically connected to the first bonding pad, and enabling the front side of the top wafer to face upwards and the front side of the first wafer to face downwards.

Figure 2C:
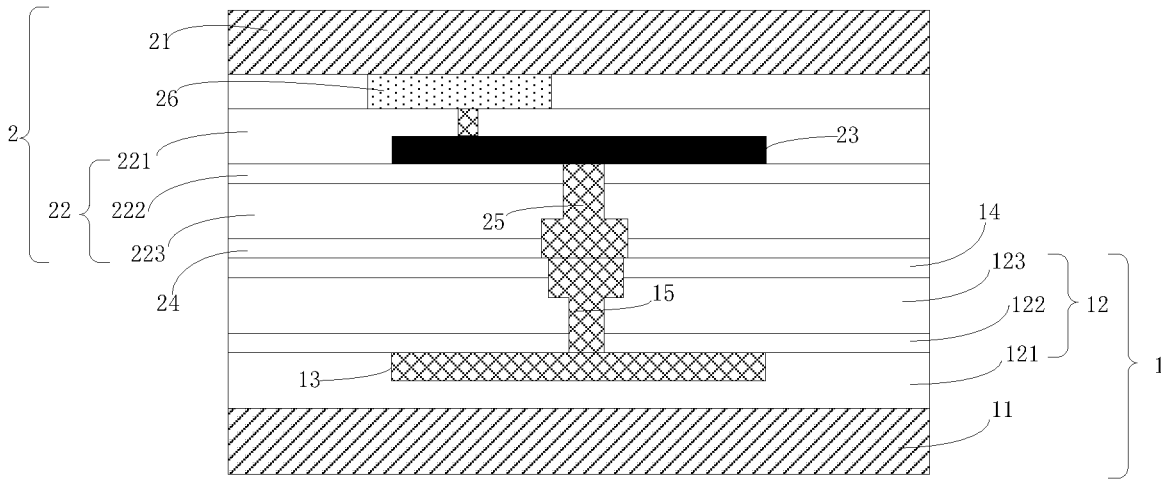

The front side of the top wafer 1 refers to the side on which the top chip device is formed, and the back side of the top wafer 1 refers to the side opposite to the front side of the top wafer 1, that is, the side of the top wafer 1 without the top chip device. The front side of the first wafer 2 refers to the side on which the first device 26 is formed, and the back side of the first wafer 2 refers to the side opposite to the front side of the first wafer 2, that is, the side of the first wafer 2 without the first device 26. As shown in FIG. 2*c*, with the front side of the top wafer 1 facing upwards and the front side of the first wafer 2 facing downwards, the top chip bonding pad 15 in the top wafer 1 is aligned with the first bonding pad 25 in the first wafer 2 and then contacts, thus realizing an electrical connection between the top chip bonding pad 15 and the first bonding pad 25. The top chip conductive layer 13 is electrically connected to the first conductive layer 23 through the top chip bonding pad 15 and the first bonding pad 25, so that the top wafer 1 and the first wafer 2 are bonded face to face.

Step 104: forming, on a back side of the first substrate, a first interconnection layer comprising a first interconnection layer-bonding pad.

Figure 2D:
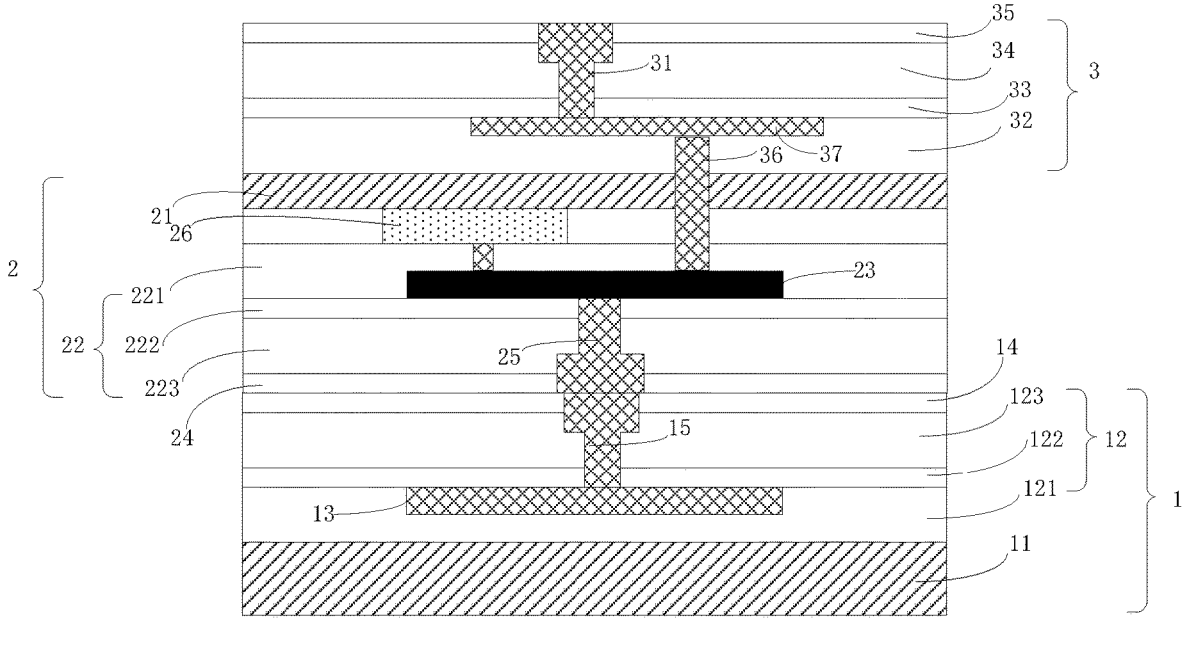

As shown in FIG. 2*d*, the back side of the first substrate 21 of the first wafer 2 is placed on top. Then, a first interconnection layer 3 is formed on the back of the first substrate 21. The first interconnection layer 3 includes a first interconnection layer-bonding pad 31, so that other wafers can be bonded continuously through the first interconnection layer-bonding pad 31.

In detail, said "forming, on a back side of the first substrate, a first interconnection layer comprising a first interconnection layer-bonding pad" recited in the step 104 includes: Thinning the back side of the first substrate.

Forming the first interconnection layer on the back surface of the first substrate, wherein the first interconnection layer-bonding pad is formed in the first interconnection layer.

As shown in FIG. 2*d*, the back side of the first substrate 21 is thinned first, and then the first interconnection layer 3 is formed on the back side of the thinned first substrate 21. The first interconnection layer 3 may include a dielectric layer 32, a barrier layer 33, an insulating layer 34 and a bonding layer 35 sequentially formed on the back side of the first substrate 21. A through silicon via (TSV) structure 36, a re-distributed layer (RDL) layer 37, and a first interconnection layer-bonding pad 31 are formed in the first interconnection layer 3, and they are electrically connected. Specifically, after the dielectric layer 32 is formed on the back side of the first substrate 21, a through silicon via (TSV) structure 36 and a re-distribution layer (RDL) layer 37 electrically connected to each other are formed in the dielectric layer 32, and the TSV structure 36 penetrates longitudinally through the first substrate 21 and extends to the first conductive layer 23 to be electrically connected to the first conductive layer 23. Then, the barrier layer 33, the insulating layer 34, and the bonding layer 35 are sequentially formed on the dielectric layer 32, and the first interconnection layer-bonding pad 31 which penetrates longitudinally through the barrier layer 33, the insulating layer 34, and the bonding layer 35 are formed. The first interconnection layer-bonding pad 31 is in contact with the RDL layer 37, so that the first interconnection layer-bonding pad 31 is electrically connected to the first conductive layer 23 through the RDL layer 37 and the TSV structure 36. The first interconnection layer-bonding pad 31 may be a damascene structure, and the materials of the first interconnection layer-bonding pad 31, the RDL layer 37, and the TSV structure 36 are all metallic materials, such as copper, aluminum, tungsten, or the like, and copper is preferred in this example.

Step 105: providing a second wafer, wherein the second wafer comprises a second substrate, and a second device and a second bonding pad that are disposed on a front side of the second substrate.

Figure 2E:
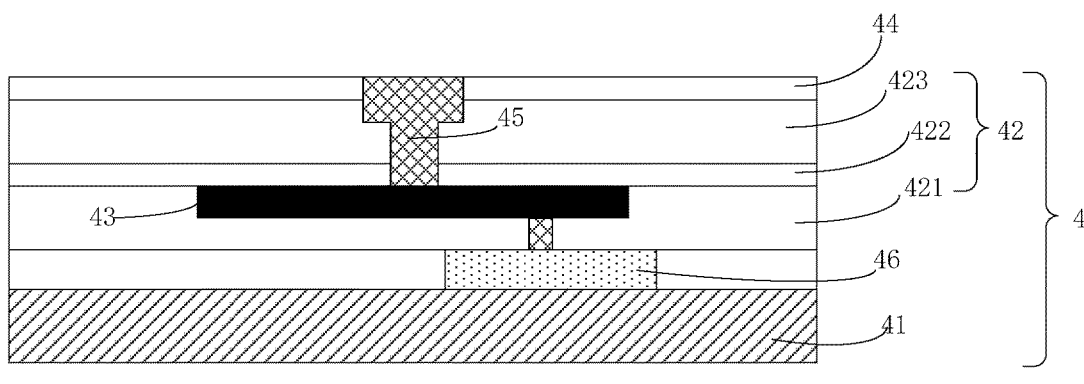

A plurality of second chips are disposed in an array on the second wafer array. FIG. 2*e* is a cross-sectional view showing a single second chip in the second wafer. As shown in FIG. 2*e*, the second wafer 4 includes a second substrate 41, which may be a semiconductor substrate. The front side of the second substrate 41 may be formed with a second device 46 with various functions. The second device 46 may include a MOS device, a sensor, a memory or other passive device, so that the second wafer 4 constitutes a wafer with different functions, for example, the second wafer 4 may be a memory wafer. It should be noted that the second wafer 4 and the top wafer 1 are wafers with different functions, and the second wafer 4 and the first wafer 2 may be wafers with the same function.

The second device 46 is covered with a second dielectric layer 42, which may be a single layer or multiple layers. For example, as shown in FIG. 2e, the second dielectric layer 42 may include a second insulating layer 421, a second barrier layer 422, and a second interlayer dielectric layer 423 disposed in sequence. The second conductive layer 43 is disposed in the second dielectric layer 42, for example, the second conductive layer 43 is disposed in the second insulating layer 421, and the second device 46 is electrically connected to the second conductive layer 43. The material of the second dielectric layer 42 may be a dielectric material such as silicon oxide, silicon nitride, or NDC. The material of the second conductive layer 43 may be a metallic material such as aluminum, copper, tungsten, or the like, and aluminum is preferred in this example. The second dielectric layer 42 is formed with a second bonding layer 44 thereon, and a material of the second bonding layer 44 may be silicon oxide, silicon nitride, silicon carbonitride, or the like.

The second bonding layer 44 and the second dielectric layer 42 are provided with a second bonding pad 45 electrically connected to the second conductive layer 43. As shown in FIG. 2e, the second bonding pad 45 longitudinally penetrates through the second bonding layer 44, the second interlayer dielectric layer 423, and the second barrier layer 422, and is in contact with the second conductive layer 43, so as to realize an electrical connection between the second bonding pad 45 and the second conductive layer 43, that is, the second bonding pad 45 is a lead-out structure of the second conductive layer 43. The second bonding pad 45 may be a damascene structure. The material of the second bonding pad 45 is a conductive material, such as copper, aluminum, tungsten, or the like, and copper is preferred in this example.

Step 106: bonding the front side of the second wafer to the first interconnection layer, the first interconnection layer-bonding pad is electrically connected to the second bonding pad, enabling the second wafer to be bonded to the first wafer to form a bonding structure, and enabling the front side of the second wafer to face downwards.

Figure 2F:
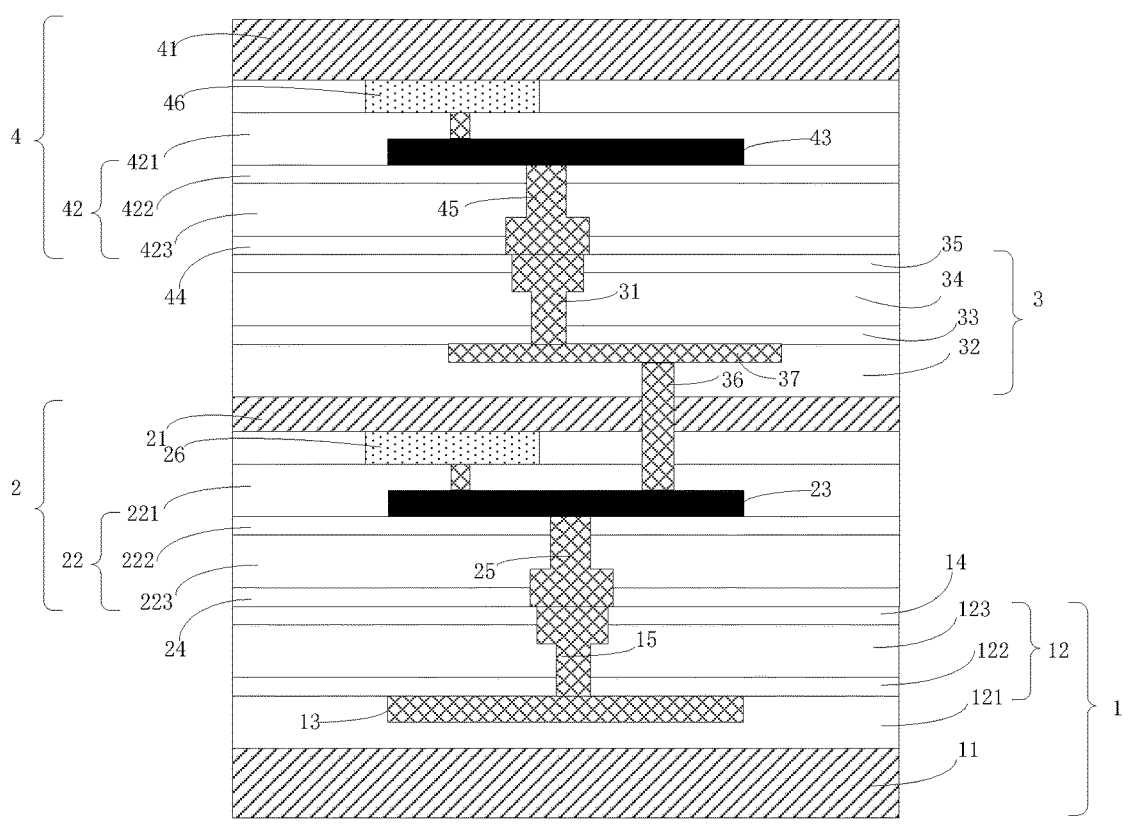

The front side of the second wafer 4 refers to the side on which the second device 46 is formed, and the back side of the second wafer 4 refers to the side opposite to the front side of the second wafer 4, that is, the side of the second wafer 4 without the second device 46. As shown in FIG. 2f, with the front side of the second wafer 4 facing downwards, the second bonding pad 45 in the second wafer 4 is aligned with the first interconnection layer-bonding pad 31 in the first interconnection layer 3 and then contacts, thus realizing an electrical connection between the second bonding pad 45 and the first interconnection layer-bonding pad 31. The second conductive layer 43 is electrically connected to the first conductive layer 23 through the second bonding pad 45 and the first interconnection layer-bonding pad 31, so that the second wafer 4 is bonded to the first wafer 2 and the top wafer 1 to form a bonding structure.

Step 107: flipping the bonding structure to put a back side of the top chip substrate to the top, enabling the front side of the first wafer to face upwards and the front side of the second wafer to face upwards, and forming a pad pin in the top chip substrate.

Figure 2G:
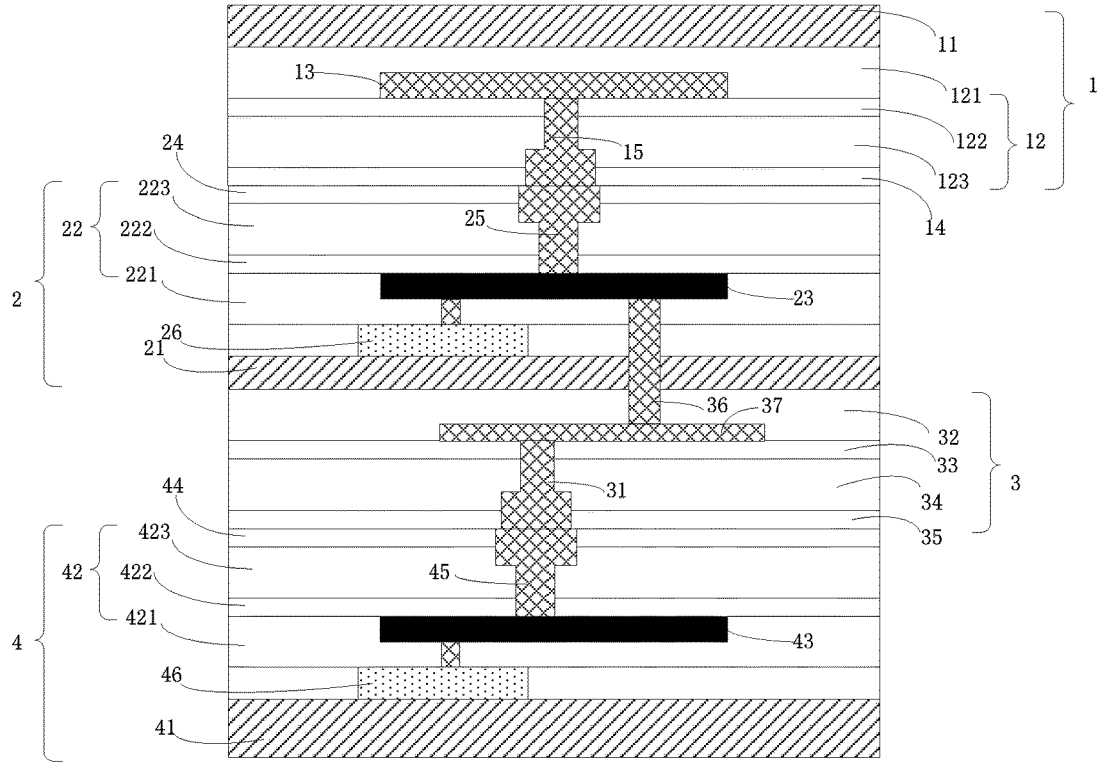
Figure 2H:
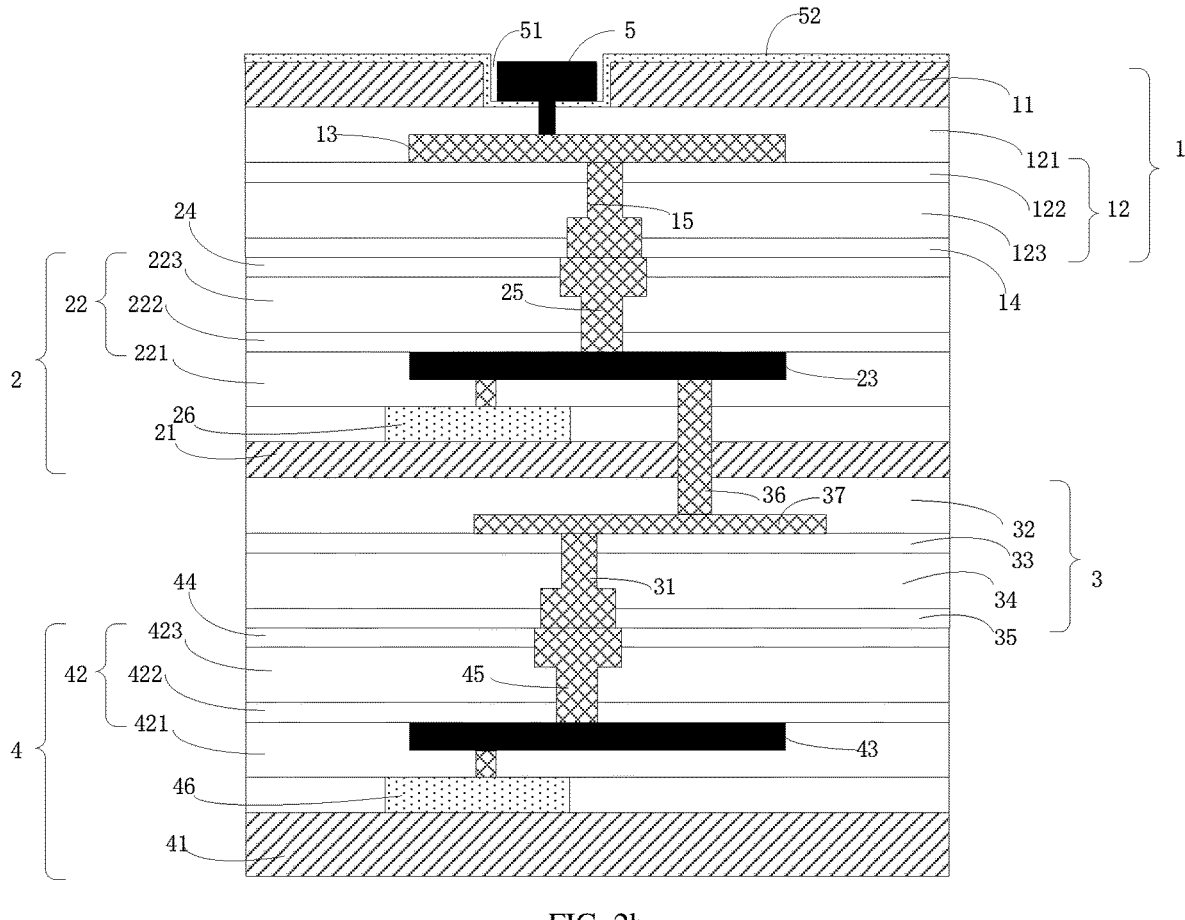

As shown in FIG. 2g, the bonding structure composed of the second wafer 4, the first wafer 2 and the top wafer 1 is flipped by 180 degrees, so that the front side of the top wafer 1 faces downwards, and the front sides of the first wafer 2 and the second wafer 4 face upwards. At this time, the back side of the top chip substrate 11 of the top wafer 1 is placed on top, so that the pad pin 5 is formed on the back side of the top wafer 1, as shown in FIG. 2h.

Specifically, the step of "forming a pad pin in the top chip substrate" includes:

thinning the back side of the top chip substrate;

forming a via penetrating through the top chip substrate;

forming a protective layer on the back side of the top chip substrate, and sidewalls and a bottom of the via; and forming a pad pin on the protective layer at the bottom of the via.

As shown in FIG. 2h, the back side of the top chip substrate 11 is thinned first, and a via 51 is formed in the thinned top chip substrate 11, and the via 51 penetrates through the top chip substrate 11. Then, a protective layer 52 for protecting the top chip substrate 11 is formed on the back side of the top chip substrate 11, and sidewalls and the bottom of the via 51. The material of the protective layer 52 may be silicon oxide, silicon nitride, or the like. After that, the pad pin 5 is formed on the protective layer 52 at the bottom of the via 51. The protective layer 52 can also be used to isolate the top chip substrate 11 from the pad pin 5, which is electrically connected to the top chip conductive layer 13 in the top wafer 1. The pad pin 5 is used for communication with an external signal. The material of the pad pin 5 can be a metallic material, such as aluminum, copper, tungsten, or the like, and aluminum is preferred in this example.

In this example, a pad pin 5 is disposed on the back side of the top wafer 1, and the front sides of the first wafer 2 and the second wafer 4 at the bottom of the top wafer 1 are disposed to face upwards, so that the bonding process flow of the first wafer 2 and the second wafer 4 is unified, and the process complexity is reduced. Further, the bonding sequence of the first wafer 2 and the second wafer 4 can be randomly changed, for example, the second wafer 4 can be bonded first, and then the first wafer 2 can be bonded, so as to meet different structural requirements and improve structural flexibility. In addition, the top wafer 1 in this example may be a logical wafer, and the first wafer 2 and the second wafer 4 may be memory wafers. It is conducive to realize unified control of the top wafer 1 over the first wafer 2 and the second wafer 4 by disposing the pad pin 5 on the back side of the top wafer 1.

In addition, compared with the manufacturing process in which the front side of the second wafer 4 is firstly bonded to the back side of the first wafer 2 (the front side of the first wafer 2 must be temporarily bonded to the carrying wafer, and the carrying wafer is removed after the front side of the second wafer 4 is bonded to the back side of the first wafer 2), the front side of the first wafer 2 is then bonded to the front side of the top wafer 1, the process in this example can be performed without using a carrying wafer, thereby simplifying the manufacturing process and reducing the process complexity. Specifically, in this example, the front side of the top wafer 1 is firstly bonded to the front side of the first wafer 2, and the back side of the first wafer 2 is bonded to the front surface of the second wafer 4 to form a bonding structure, then the bonding structure is flipped, so that the front side of the top wafer 1 faces downwards, and the front sides of the first wafer 2 and the second wafer 4 face upwards.

In some examples, the conductive layers in the top wafer 1, the first wafer 2, and the second wafer 4 may include multiple layers. For example, as shown in FIG. 3, the top chip conductive layer 13 in the top wafer 1 may include a top chip top conductive layer 131 and a top chip bottom conductive layer 132 that are electrically connected (connection relationship is not shown). The top chip conductive layer 13 is disposed between the top chip substrate 11 and the top chip bonding pad 15. The top chip bottom conductive layer 132 refers to a conductive layer disposed closest to the top chip substrate 11 in the top chip conductive layer 13, and the top chip bottom conductive layer 132 is electrically connected to the top chip device in the top chip 1 and the pad pin 5. The top chip top conductive layer 131 refers to a conductive layer disposed closest to the top chip bonding pad 15 in the top conductive layer 13, and the top conductive layer 131 is electrically connected to the top chip bonding pad 15.

The first conductive layer 23 in the first wafer 2 may include a first top conductive layer 231 and a first bottom conductive layer 232 (connection relationship is not shown) that are electrically connected. The first conductive layer 23 is disposed between the first substrate 21 and the first bonding pad 25. The first bottom conductive layer 232 refers to a conductive layer disposed closest to the first substrate 21 in the first conductive layer 23, and the first bottom conductive layer 232 is electrically connected to the first device 26 in the first chip 2 and the first interconnection layer-bonding pad 31. The first top conductive layer 231 refers to a conductive layer disposed closest to the first bonding pad 25 in the first conductive layer 23, and the first top conductive layer 231 is electrically connected to the first bonding pad 25.

The second conductive layer 43 in the second wafer 4 may include a second top conductive layer 431 and a second bottom conductive layer 432 (connection relationship is not shown) that are electrically connected. The second conductive layer 43 is disposed between the second substrate 41 and the second bonding pad 45. The second bottom conductive layer 432 refers to a conductive layer disposed closest to the second substrate 41 in the second conductive layer 43, and the second bottom conductive layer 432 is electrically connected to the second device 46 in the second chip 4. The second top conductive layer 431 refers to a conductive layer disposed closest to the second bonding pad 45 in the second conductive layer 43, and the second top conductive layer 431 is electrically connected to the second bonding pad 45.

In some examples, after the second wafer 4 is formed, another wafer can be further bonded to the back side of the second wafer 4, and the number of wafers may be set according to actual requirements, which is not specifically limited herein. In case the first wafer 2 and the second wafer 4 are memory wafers, another memory wafer can be bonded to the back side of the second wafer 4 continuously, so that memory capacity of a semiconductor device can be improved.

Specifically, after the step of "bonding the front side of the second wafer to the first interconnection layer", and before the step of "flipping the bonding structure", the method further includes:

Forming, on the back side of the second substrate, a second interconnection layer comprising a second interconnection layer-bonding pad.

Providing a third wafer, the third wafer comprising a third substrate, and a third device and a third bonding pad that are disposed on a front side of the third substrate.

Bonding a front side of the third wafer to the second interconnection layer, the second interconnection layer-bonding pad being electrically connected to the third bonding pad, enabling the third wafer to be bonded to the second wafer, and enabling the front side of the third wafer to face downwards.

FIG. 4 is a schematic diagram of a structure after the top wafer 1, the first wafer 2, the second wafer 4 and the third wafer 7 are bonded, with the front side of the top wafer 1 facing downwards and the front sides of the first wafer 2, the second wafer 4 and the third wafer 7 facing upwards. Specifically, after the second wafer 4 is bonded with the first wafer 2 and the top wafer 1 (at this time, the front side of the top wafer 1 faces upwards, and the front sides of the first wafer 2 and the second wafer 4 face downwards), a second interconnection layer 6 is further formed on the back side of the second wafer 4. The second interconnection layer 6 includes a second interconnect layer bonding pad 61, which is electrically connected to the second conductive layer 43. The material of the second interconnection layer-bonding pad 61 may be a metallic material, for example, copper, aluminum, tungsten, or the like, and copper is preferred in this example. The structure of the second interconnection layer 6 is the same as that of the first interconnection layer 3, and details are not described herein.

Meanwhile, a third wafer 7 is provided. The third wafer 7 includes a third substrate 71, and a third device 76 disposed on the front side of the third substrate 71. The third device 76 may include a MOS device, a sensor, a memory or other passive device, so that the third wafer 7 constitutes a wafer with different functions, for example, the third wafer 7 may be a memory wafer. It should be noted that the third wafer 7 and the top wafer 1 are wafers with different functions. The third wafer 7, the first wafer 2, and the second wafer 4 may be wafers with the same function.

The third device 76 is covered with a third dielectric layer 72. A third conductive layer 73 is formed in the third dielectric layer 72, and the third conductive layer 73 is electrically connected to the third device 76. The material of the third conductive layer 73 may be a metallic material such as aluminum, copper, tungsten, or the like, and aluminum is preferred in this example. A third bonding layer 74 is formed on the third dielectric layer 72. A third bonding pad 75 electrically connected to the third conductive layer is formed in the third dielectric layer 72 and the third bonding layer 74, that is, the third bonding pad 75 is a lead-out structure of the third conductive layer 73. The material of the third bonding pad 75 may be a metallic material such as copper, aluminum, tungsten, or the like, and copper is preferred in this example. The structure of the third wafer 7 is similar to those of the first wafer 2 and the second wafer 4, and details are not described herein.

The front side of the third wafer 7 refers to the side on which the third device 76 is formed, and the back side of the third wafer 7 refers to the side opposite to the front side of the third wafer 7, that is, the side of the third wafer 7 without the third device 76. Then, the front side of the third wafer 7 is allowed to face downwards, so that the third bonding pad 75 in the third wafer 7 is aligned with the second interconnection layer-bonding pad 61 in the second interconnection layer 6 and then contacts, thus realizing an electrical connection between the third bonding pad 75 and the second interconnection layer-bonding pad 61. The third conductive layer 73 is electrically connected to the second conductive layer 43 through the third bonding pad 75 and the second interconnection layer-bonding pad 61, so that the third wafer 7 is bonded to the second wafer 4.

After the third wafer 7 is bonded to the second wafer 4, the top wafer 1, the first wafer 2, the second wafer 4 and the third wafer 7 form a bonding structure, and it is flipped as a whole, so that the back side of the top chip substrate 11 of the top wafer 1 is placed on top, the top wafer 1 faces downwards, and the front sides of the first wafer 2, the second wafer 4, and the third wafer 7 all face upwards, thus ensuring that the front sides of all the wafers stacked on the bottom of the top wafer 1 face upwards.

Since the processes of bonding the first wafer 2, the second wafer 4 and the third wafer 7 are the same, and the circuit wiring modes are the same, the bonding sequence among the first wafer 2, the second wafer 4 and the third wafer 7 can be changed at will, for example, the second wafer 4 can be bonded firstly, then the third wafer 7 can be bonded, and finally the first wafer 2 can be bonded, so as to meet different structural requirements and improve structural flexibility.

As can be seen from the above, according to the method for manufacturing a semiconductor device provided in examples of the present disclosure, after the top wafer 1 and the first wafer 2 are bonded face to face, the first interconnection layer 3 is formed on the back side of the first wafer 2, so that the front side of the second wafer 4 can be bonded to the first interconnection layer 3 to form a bonding structure. The bonding structure is flipped, and the back side of the top wafer 1 is placed on top to form a pad pin 5 on the back side of the top wafer 1, so that the front side of the top wafer 1 faces downwards and the front sides of the first wafer 2 and the second wafer 4 face upwards, thereby ensuring that all the front sides of the bottom wafers of the top wafer 1 face upwards, unifying the circuit design and the process flow of the bottom wafers, reducing the process complexity, and adjusting the bonding sequence between the bottom wafers at will, thereby improving the structural flexibility.

It should be noted that the semiconductor devices manufactured in the above examples are of wafer structures. A plurality of top chips are disposed in an array on the top wafer, a plurality of first chips are disposed in an array on the first wafer, a plurality of second chips are disposed in an array on the second wafer array, and the plurality of top chips, the plurality of first chips and the plurality of second chips are correspondingly bonded one by one to form a wafer structure. The wafer structure may be cut to form a chip structure including a bonding top chip, a first chip, and a second chip.

Accordingly, an embodiment of the present disclosure further provides a semiconductor device, which is of a chip structure.

FIG. 5 is a schematic structural diagram of a semiconductor device according to an embodiment of the present disclosure.

As shown in FIG. 5, a semiconductor device according to an embodiment of the present disclosure includes a top chip 10, a first chip 20, a second chip 40, a first interconnection layer 3, and a pad pin 5. The first chip 20 and the second chip 40 may be chips with the same function. The top chip 10, the first chip 20 and the second chip 40 are chips with different functions. For example, the top chip 10 is a logic chip, and the first chip 20 and the second chip 40 are memory chips.

The first chip 20 includes a first substrate 21 on which a first device 26 with various functions may be formed. The first device 26 may include a MOS device, a sensor, a memory, or other passive device, so that the first chip 20 constitutes a chip with different functions.

The first device 26 is covered with a first dielectric layer 22, which may be a single layer or multiple layers. For example, the first dielectric layer 22 may include a first insulating layer 221, a first barrier layer 222, and a first interlayer dielectric layer 223 disposed in sequence. A first conductive layer 23 is provided in the first dielectric layer 22, for example, the first conductive layer 23 is provided in the first insulating layer 221, and the first device 26 and the first interconnection layer-bonding pad 31 are electrically connected to the first conductive layer 23, respectively. The material of the first conductive layer 23 is a metallic material such as aluminum, copper, tungsten, or the like, and aluminum is preferred in this example. A first bonding layer 24 is formed on the first dielectric layer 22.

A first bonding pad 25 electrically connected to the first conductive layer 23 is disposed in the first bonding layer 24 and the first dielectric layer 22. The first bonding pad 25 longitudinally penetrates through the first bonding layer 24, the first interlayer dielectric layer 223 and the first barrier layer 222, and is in contact with the first conductive layer 23, so as to realize an electrical connection between the first bonding pad 25 and the first conductive layer 23, that is, the first bonding pad 25 is a lead-out structure of the first conductive layer 23. The first bonding pad 25 may be a damascene structure. The material of the first bonding pad 25 is a conductive material, such as copper, aluminum, tungsten, or the like, and copper is preferred in this example.

The top chip 10 is disposed on the front side of the first chip 20. The top chip 10 includes a top chip substrate 11. The front side of the top chip substrate 11 may form a top chip device (not shown) with various functions. The top chip device may include a MOS device, a sensor, a memory, or other passive device.

The top chip device is covered with a top chip dielectric layer 12 on the side away from the top chip substrate 11, and the top chip dielectric layer 12 may be a single layer or multiple layers. For example, the top chip dielectric layer 12 may include a top chip insulating layer 121, a top chip barrier layer 122 and a top chip interlayer dielectric layer 123. The top chip dielectric layer 12 is provided with a top chip conductive layer 13, for example, the top chip conductive layer 13 is disposed in the top chip insulating layer 121, and the top chip device is electrically connected to the top chip conductive layer 13. The material of the top chip conductive layer 13 is a metallic material such as copper, aluminum, tungsten, or the like, and copper is preferred in this example. A top chip bonding layer 14 is formed on the top chip dielectric layer 12.

A top chip bonding pad 15 electrically connected to the top chip conductive layer 13 is disposed in the top chip bonding layer 14 and the top chip dielectric layer 12. The top chip bonding pad 15 longitudinally penetrates through the top chip bonding layer 14, the top chip interlayer dielectric layer 123 and the top chip barrier layer 122, and is in contact with the top chip conductive layer 13, so as to realize an electrical connection between the top chip bonding pad 15 and the top chip conductive layer 13, that is, the top chip bonding pad 15 is a lead-out structure of the top chip conductive layer 13. The top chip bonding pad 15 may be a damascene structure. The material of the top chip bonding pad 15 is a conductive material, such as copper, aluminum, tungsten, or the like, and copper is preferred in this example.

The top chip bonding pad 15 in the top chip 10 is electrically connected to the first bonding pad 25 in the first chip 20, so that the top chip conductive layer 13 is electrically connected to the first conductive layer 23 through the top chip bonding pad 15 and the first bonding pad 25, allowing the front side of the top chip 10 to be bonded to the front side of the first chip 20, that is, the front side of the top chip 10 faces opposite the front side of the first chip 20, for example, the front side of the first chip 20 faces upwards and the front side of the top chip 10 faces downwards. The front side of the top chip 10 refers to the side on which the top chip device is formed. The front side of the first chip 20 refers to the side on which the first device 26 is formed.

The pad pin 5 is disposed in the top chip substrate 11, and the pad pin 5 is electrically connected to the top chip conductive layer 13 in the top chip 10. The pad pin 5 is used for communication with an external signal. The material of the pad pin 5 can be a metallic material, such as aluminum, copper, tungsten, or the like, and aluminum is preferred in this example. Specifically, the semiconductor device further includes a via 51 penetrating through the top chip substrate 11, and a protective layer 52 disposed on the back side of the top chip substrate 11, and sidewalls and the bottom of the via 51. The pad pin 5 is disposed on the protective layer 52 disposed at the bottom of the via 51, and the pad pin 5 is electrically connected to the top chip conductive layer 13 in the top chip 10. The protective layer 52 is used to protect the top chip substrate 11 and isolate the top chip substrate 11 and the pad pin 5. The material of the protective layer 52 may be silicon oxide, silicon nitride, or the like.

The first interconnect layer 3 is disposed on the back side of the first chip 20, and a first interconnection layer-bonding pad 31 is formed in the first interconnect layer 3.

The second chip 40 is disposed on the side of the first interconnect layer 3 away from the first chip 20. The second chip 40 includes a second substrate 41 on which a second device 46 with various functions may be formed. The second device 46 may include a MOS device, a sensor, a memory, or other passive device, so that the second chip 40 constitutes a chip with different functions.

The second device 46 is covered with a second dielectric layer 42, which may be a single layer or multiple layers. For example, the second dielectric layer 42 may include a second insulating layer 421, a second barrier layer 422 and a second interlayer dielectric layer 423 disposed in sequence. The second conductive layer 43 is provided with a second dielectric layer 42, for example, the second conductive layer 43 is disposed in the second insulating layer 421, and the second device 46 is electrically connected to the second conductive layer 43. The material of the second conductive layer 43 may be a metallic material such as aluminum, copper, tungsten, or the like, and aluminum is preferred in this example. A second bonding layer 44 is formed on the second dielectric layer 42.

A second bonding pad 45 electrically connected to the second conductive layer 43 is disposed in the second bonding layer 44 and the second dielectric layer 42. The second bonding pad 45 longitudinally penetrates through the second bonding layer 44, the second interlayer dielectric layer 423 and the second barrier layer 422, and is in contact with the second conductive layer 43, so as to realize an electrical connection between the second bonding pad 45 and the second conductive layer 43, that is, the second bonding pad 45 is a lead-out structure of the second conductive layer 43. The second bonding pad 45 may be a damascene structure. The material of the second bonding pad 45 is a conductive material, such as copper, aluminum, tungsten, or the like, and copper is preferred in this example.

The first interconnection layer-bonding pad 31 is electrically connected to the second bonding pad 45, so that the first conductive layer 23 is electrically connected to the second conductive layer 43 through the first interconnection layer-bonding pad 31 and the second bonding pad 45, thus realizing bonding between the second chip 40 and the first chip 20. The front side of the second chip 40 faces towards a direction the same as that of the first chip 20, for example, the front side of the first chip 20 faces upwards, and the front side of the second chip 40 faces upwards. The front side of the second chip 40 refers to the side on which the second device 46 is formed.

In some examples, the conductive layers in the top chip 10, the first chip 20, and the second chip 40 may include multiple layers. For example, as shown in FIG. 5, the top chip conductive layer 13 in the top chip 10 may include a top chip top conductive layer 131 and a top chip bottom conductive layer 132 that are electrically connected. The top chip conductive layer 13 is disposed between the top chip substrate 11 and the top chip bonding pad 15. The top chip bottom conductive layer 132 refers to a conductive layer disposed closest to the top chip substrate 11 in the top chip conductive layer 13, and the top chip bottom conductive layer 132 is electrically connected to the top chip device in the top chip 1 and the pad pin 5. The top chip top conductive layer 131 refers to a conductive layer disposed closest to the top chip bonding pad 15 in the top conductive layer 13, and the top conductive layer 131 is electrically connected to the top chip bonding pad 15.

The first conductive layer 23 in the first chip 20 may include a first top conductive layer 231 and a first bottom conductive layer 232 that are electrically connected. The first conductive layer 23 is disposed between the first substrate 21 and the first bonding pad 25. The first bottom conductive layer 232 refers to a conductive layer disposed closest to the first substrate 21 in the first conductive layer 23, and the first bottom conductive layer 232 is electrically connected to the first device 26 in the first chip 20 and the first interconnect layer bonding pad 31. The first top conductive layer 231 refers to a conductive layer disposed closest to the first bonding pad 25 in the first conductive layer 23, and the first top conductive layer 231 is electrically connected to the first bonding pad 25.

The second conductive layer 43 in the second chip 40 may include a second top conductive layer 431 and a second bottom conductive layer 432 that are electrically connected. The second conductive layer 43 is disposed between the second substrate 41 and the second bonding pad 45. The second bottom conductive layer 432 refers to a conductive layer disposed closest to the second substrate 41 in the second conductive layer 43, and the second bottom conductive layer 432 is electrically connected to the second device 46 in the second chip 4. The second top conductive layer 431 refers to a conductive layer disposed closest to the second bonding pad 45 in the second conductive layer 43, and the second top conductive layer 431 is electrically connected to the second bonding pad 45.

In some examples, as shown in FIG. 6, the semiconductor device further includes a larger number of chips, and the number of which may be set according to actual requirements, which is not specifically limited herein. For example, the semiconductor device further includes a second interconnection layer disposed on the back side of the second chip and a third chip disposed on the second interconnecting layer away from the second chip.

The second interconnection layer 6 includes a second interconnecting layer bonding pad 61, which is electrically connected to the second conductive layer 43. The material of the second interconnection layer-bonding pad 61 may be a metallic material such as copper, aluminum, tungsten, or the like, and copper is preferred in this example. The structure of the second interconnection layer 6 is the same as that of the first interconnection layer 3, and details are not described herein.

The third chip 70 includes a third substrate 71, and a third device 76 disposed on the front side of the third substrate 71. The third device 76 may include a MOS device, a sensor, a memory, or other passive device, so that the third chip 70 constitutes a chip with different functions. For example, the third chip 70 may be a memory chip. It should be noted that the third chip 70 and the top chip 10 are chips with different functions. The third chip 70, the first chip 20 and the second chip 40 may be chips with the same function.

The third device 76 is covered with a third dielectric layer 72. A third conductive layer 73 is formed in the third dielectric layer 72, and the third conductive layer 73 is electrically connected to the third device 76. The material of the third conductive layer 73 may be a metallic material such as aluminum, copper, tungsten, or the like, and aluminum is preferred in this example. A third bonding layer 74 is formed on the third dielectric layer 72. A third bonding pad 75 electrically connected to the third conductive layer is formed in the third dielectric layer 72 and the third bonding layer 74, that is, the third bonding pad 75 is a lead-out structure of the third conductive layer 73. The material of the third bonding pad 75 may be a metallic material such as copper, aluminum, tungsten, or the like, and copper is preferred in this example. The structure of the third chip 70 is similar to those of the first chip 20 and the second chip 40, and details are not described herein.

The third bonding pad 75 is electrically connected to the second interconnect layer bonding pad 61, so that the third conductive layer 73 is electrically connected to the second conductive layer 43 through the third bonding pad 75 and the first interconnect layer bonding pad 61, allowing the third chip 70 to be bonded to the second chip 40. The front side of the third chip 70 faces towards a direction the same as that of the second chip 40, for example, the front side of the second chip 40 faces upwards, and the front side of the third chip 70 faces upwards. The front side of the third chip 70 refers to the side on which the third device 76 is formed.

According to the semiconductor devices provided in examples of the present disclosure, a pad pin 5 can be disposed on the back side of the top chip 1, the front side of the top chip 10 faces upwards, and the front sides of the first chip 20 and the second chip 40 at the bottom of the top chip 10 face downwards, thus the circuit design and the process of the first chip 1 and the second chip 4 are unified, the process complexity is reduced, and the bonding sequence of the first chip 10 and the second chip 40 can be changed at will, for example, the second chip can be bonded firstly, and then the first chip 10 can be bonded, so as to meet different structural requirements and improve structural flexibility.

In summary, while the present disclosure has been described with the aforementioned preferred embodiments, it is preferable that the specifications relating to the above embodiments should be construed as exemplary rather than as limiting of the present disclosure. One of ordinary skill in the art can make a variety of modifications and variations without departing from the spirit and scope of the present disclosure as defined by the following claims.

What is claimed is:
1. A method for manufacturing a semiconductor device, comprising:
   providing a top wafer, wherein the top wafer comprises a top chip substrate and a top chip bonding pad disposed on a front side of the top chip substrate;

providing a first wafer, wherein the first wafer comprises a first substrate, and a first device and a first bonding pad that are disposed on a front side of the first substrate;
   bonding the front side of the top wafer to the front side of the first wafer and electrically connecting the top chip bonding pad to the first bonding pad, so that the front side of the top wafer faces upwards, and the front side of the first wafer faces downwards;
   forming, on a back side of the first substrate, a first interconnection layer comprising a first interconnection layer-bonding pad;
   providing a second wafer, wherein the second wafer comprises a second substrate, a second device and a second bonding pad that are disposed on a front side of the second substrate;
   bonding the front side of the second wafer to the first interconnection layer, and electrically connecting the first interconnection layer-bonding pad to the second bonding pad, so that the second wafer is bonded to the first wafer to form a bonding structure in which the front side of the second wafer faces downwards; and
   flipping the bonding structure to put a back side of the top chip substrate to the top, enabling the front side of the first wafer to face upwards and the front side of the second wafer to face upwards, and forming a pad pin in the top chip substrate;
   wherein the step of "forming a pad pin in the top chip substrate" comprises:
   thinning the back side of the top chip substrate;
   forming a via penetrating through the top chip substrate;
   forming a protective layer on the back side of the top chip substrate, and sidewalls and a bottom of the via; and
   forming a pad pin on the protective layer on the bottom of the via.
   2. The method according to claim 1, wherein the step of "forming, on a back side of the first substrate, a first interconnection layer comprising a first interconnection layer-bonding pad" comprises:
   thinning the back side of the first substrate; and
   forming the first interconnection layer on the back surface of the first substrate, wherein the first interconnection layer-bonding pad is formed in the first interconnection layer.
   3. The method according to claim 1, wherein after the step of "bonding the front side of the second wafer to the first interconnection layer", and before the step of "flipping the bonding structure", the method further comprises:
   forming, on the back side of the second substrate, a second interconnection layer comprising a second interconnection layer-bonding pad;
   providing a third wafer, wherein the third wafer comprises a third substrate, and a third device and a third bonding pad that are disposed on a front side of the third substrate; and
   bonding a front side of the third wafer to the second interconnection layer, and electrically connecting the second interconnection layer-bonding pad to the third bonding pad so that the third wafer is bonded to the second wafer in which the front side of the third wafer faces downwards.
   4. The method according to claim 1, wherein the top wafer further comprises a top chip conductive layer between the top chip substrate and the top chip bonding pad, and the top chip conductive layer is electrically connected to the top chip bonding pad and the pad pin, respectively;

the first wafer further comprises a first conductive layer between the first device and the first bonding pad, and the first conductive layer is electrically connected to the first device, the first bonding pad, and the first interconnection layer-bonding pad, respectively; and the second wafer further comprises a second conductive layer between the second device and the second bonding pad, and the second conductive layer is electrically connected to the second device and the second bonding pad, respectively.

5. The method according to claim 4, wherein the top chip conductive layer comprises a top chip top conductive layer and a top chip bottom conductive layer that are electrically connected, the top chip top conductive layer is electrically connected to the top chip bonding pad, and the top chip bottom conductive layer is electrically connected to the pad pin;

the first conductive layer comprises a first top conductive layer and a first bottom conductive layer, the first top conductive layer is electrically connected to the first bonding pad, and the first bottom conductive layer is electrically connected to the first device and the first interconnection layer-bonding pad; and the second conductive layer comprises a second top conductive layer and a second bottom conductive layer that are electrically connected, the second top conductive layer is electrically connected to the second bonding pad, and the second bottom conductive layer is electrically connected to the second device.

6. The method according to claim 4, wherein a material of the top chip conductive layer, the first interconnection layer-bonding pad, the first bonding pad, and the second bonding pad is copper, and a material of the first conductive layer, the second conductive layer, and the pad pin is aluminum.

7. The method according to claim 1, wherein the top wafer is a logic wafer, and the first wafer and the second wafer are memory wafers.

8. A semiconductor device, wherein the semiconductor device is manufactured by the method according to claim 1, and the semiconductor device comprises:

a first chip comprising a first substrate and a first device and a first bonding pad disposed on a front side of the first substrate;

a top chip disposed on a front side of the first chip, wherein the top chip comprises a top chip substrate and a top chip bonding pad disposed between the top chip substrate and the first chip, the top chip bonding pad is electrically connected to the first bonding pad, so that a front side of the top wafer is bonded face to face with the front side of the first wafer;

a pad pin disposed on a back side of the top chip;

a first interconnection layer on a back side of the first chip, wherein the first interconnection layer comprises a first interconnection layer-bonding pad; and a second chip on a side of the first interconnection layer away from the first chip, wherein the second chip comprises a second substrate and a second device and a second bonding pad on a front side of the second substrate, and the second bonding pad is electrically connected to the first interconnection layer-bonding pad so that a front side of the second chip is bonded to the first interconnection layer.

9. The method according to claim 1, wherein the top wafer further comprises a top chip dielectric layer and a top chip bonding layer disposed on the top chip dielectric layer, and the top chip dielectric layer comprises a top chip insulating layer, a top chip barrier layer, and an top chip interlayer dielectric layer that are disposed in sequence.

10. The method according to claim 9, wherein the top chip bonding pad longitudinally penetrates through the top chip bonding layer, the top chip interlayer dielectric layer and the top chip barrier layer.

11. The method according to claim 10, wherein a top chip conductive layer is disposed in the top chip insulating layer, and a thickness of the top chip conductive layer is less that of the top chip insulating layer.

12. The method according to claim 11, wherein the top chip bonding pad is electrically connected to the top chip conductive layer.

13. The method according to claim 9, wherein a material of the top chip bonding layer is silicon oxide, silicon nitride, or silicon carbonitride.

14. A semiconductor device comprising:

a first chip comprising a first substrate and a first device and a first bonding pad disposed on a front side of the first substrate;

a top chip disposed on a front side of the first chip, wherein the top chip comprises a top chip substrate and a top chip bonding pad disposed between the top chip substrate and the first chip, the top chip bonding pad is electrically connected to the first bonding pad, so that a front side of the top wafer is bonded face to face with the front side of the first wafer;

a pad pin disposed on a back side of the top chip;

a first interconnection layer on a back side of the first chip, wherein the first interconnection layer comprises a first interconnection layer-bonding pad; and a second chip on a side of the first interconnection layer away from the first chip, wherein the second chip comprises a second substrate and a second device and a second bonding pad on a front side of the second substrate, and the second bonding pad is electrically connected to the first interconnection layer-bonding pad so that a front side of the second chip is bonded to the first interconnection layer;

wherein the semiconductor device further comprises a via penetrating through the top chip substrate, and a protective layer at least formed on sidewalls and a bottom of the via that disposed in the top chip substrate, and the pad pin is formed on the protective layer at the bottom of the via to be separated from the top chip substrate.

15. The semiconductor device according to claim 14, wherein the semiconductor device further comprises a second interconnect layer disposed on a back side of the second chip, wherein the second interconnect layer comprises a second interconnection layer-bonding pad; and a third chip disposed at the second interconnect layer away from the second chip, wherein the third chip comprises a third substrate and a third device and a third bonding pad disposed on a front side of the third substrate, and the third bonding pad is electrically connected to the second interconnection layer-bonding pad so that a front side of the third chip is bonded to the second interconnection layer.

16. The semiconductor device according to claim 14, wherein the top wafer further comprises a top chip conductive layer between the top chip substrate and the top chip bonding pad, and the top chip conductive layer is electrically connected to the top chip bonding pad and the pad pin, respectively;

the first chip further comprises a first conductive layer between the first device and the first bonding pad, and the first conductive layer is electrically connected to the first device, the first bonding pad, and the first interconnection layer-bonding pad, respectively; and the second chip further comprises a second conductive layer between the second device and the second bonding pad, and the second conductive layer is electrically connected to the second device and the second bonding pad, respectively.

17. The semiconductor device according to claim 16, wherein the top chip conductive layer comprises a top chip top conductive layer and a top chip bottom conductive layer that are electrically connected, the top chip top conductive layer is electrically connected to the top chip bonding pad, and the top chip bottom conductive layer is electrically connected to the pad pin;

the first conductive layer comprises a first top conductive layer and a first bottom conductive layer, the first top conductive layer is electrically connected to the first bonding pad, and the first bottom conductive layer is electrically connected to the first device and the first interconnection layer-bonding pad; and the second conductive layer comprises a second top conductive layer and a second bottom conductive layer, the second top conductive layer is electrically connected to the second bonding pad, and the second bottom conductive layer is electrically connected to the second device.

18. The semiconductor device according to claim 14, wherein a material of the top chip conductive layer, the first interconnection layer-bonding pad, the first bonding pad, and the second bonding pad is copper, and a material of the first conductive layer, the second conductive layer, and the pad pin is aluminum.

19. The semiconductor device according to claim 14, wherein the top chip is a logic chip, and the first chip and the second chip are memory chips.

20. The semiconductor device according to claim 14, wherein the front side of the first chip faces towards a direction the same as that of the second chip, and the front side of the top chip faces towards a direction opposite to the front side of the first chip.

* * * * *